(12) United States Patent
Lin et al.

(10) Patent No.: US 7,906,993 B1
(45) Date of Patent: Mar. 15, 2011

(54) HIGH LINEARITY VOLTAGE-CURRENT CONVERTER ABLE TO COMPENSATE FOR MOBILITY DEGRADATION

(75) Inventors: Chun-Wei Lin, Yunlin County (TW); You-Cheng Huang, Yunlin County (TW); Chi-Fu Wang, Yunlin County (TW)

(73) Assignee: National Yunlin University of Science and Technology, Douliu, Yunlin County (TW)

( * ) Notice: Subject to any disclaimer, the term of this patent is extended or adjusted under 35 U.S.C. 154(b) by 0 days.

(21) Appl. No.: 12/613,279

(22) Filed: Nov. 5, 2009

(51) Int. Cl.
*H02M 11/00* (2006.01)
*H03F 3/45* (2006.01)

(52) U.S. Cl. ........ 327/103; 327/543; 323/311; 323/315; 323/316

(58) Field of Classification Search .................. 327/103, 327/543; 323/311, 315, 316
See application file for complete search history.

(56) References Cited

U.S. PATENT DOCUMENTS

| | | | | |
|---|---|---|---|---|
| 7,102,400 B1 * | 9/2006 | Mulders | ........................ | 327/157 |
| 7,323,857 B2 * | 1/2008 | Sung | ............................ | 323/316 |
| 7,332,957 B2 * | 2/2008 | Hasegawa | ..................... | 327/543 |

* cited by examiner

*Primary Examiner* — Lincoln Donovan
*Assistant Examiner* — John W Poos
(74) *Attorney, Agent, or Firm* — Muncy, Geissler, Olds, & Lowe, PLLC

(57) ABSTRACT

A high linearity voltage-current converter able to compensate for mobility degradation comprises a first constant current source circuit, a first current mirror unit, a second constant current source circuit, a second current mirror unit, a seventh MOS transistor and an eighth MOS transistor. The first current mirror unit is coupled to the first constant current source circuit, and the second current mirror unit is coupled to the second constant current source circuit. The seventh MOS transistor, the first current mirror unit and the second current mirror unit are coupled to each other at a third joint point of a first conducting wire. The eighth MOS transistor is coupled to the seventh MOS transistor. Thereby, the electronic components used in the present invention can operate more efficiently.

17 Claims, 4 Drawing Sheets

HIGH LINEARITY VOLTAGE-CURRENT CONVERTER ABLE TO COMPENSATE FOR MOBILITY DEGRADATION

FIELD OF THE INVENTION

The present invention relates to an improved converter, particularly to a high linearity voltage-current converter able to compensate for mobility degradation.

BACKGROUND OF THE INVENTION

Conventionally, designing a converter begins from deriving the relationship of voltage and current. The circuit design technology is used to modify the relationship into a linear equation, wherein the carrier mobility is usually assumed to be a constant. In fact, the carrier mobility is not necessarily a constant in that the carrier mobility varies with gate voltage and that the equivalent mobility decreases when the carrier mobility reaches a saturation value. The present invention does not intend to deal with the second phenomenon because it will be solved via eliminating noise in designing an analog circuit.

Based on the voltage-current relationships in the saturation region and the linear region, the current values in the two regions are summed up with the quadratic term of the linear region being eliminated in designing a traditional voltage-current converter.

The conventional voltage-current relationships in the saturation region and the linear region may be expressed by Equation 1 and Equation 2:

$$I_{lin} = K_{lin}\left[(V_{GS} - V_T)V_{DS} - \frac{V_{DS}^2}{2}\right] \quad (1)$$

$$I_{sat} = \frac{1}{2}K_{sat}(V_{GS} - V_T)^2 \quad (2)$$

Suppose $$K_{lin}\left(\frac{V_{DS}^2}{2}\right) = \frac{1}{2}K_{lin}(V_{GS} - V_T)^2 \quad (3)$$

Substitute Equation (3) into Equation (1) and Equation (2) to eliminate the quadratic term of the linear region. Then Equation (4) is obtained:

$$I_{out} = K[(V_{GS} - V_T)V_{DS}] \quad (4)$$

wherein the carrier mobility K is not a constant. Refer to FIG. 1 for voltage-current relationships in the conventional technology. When K is a constant, the relationship is represented by the line segment A. However, the actual relationship is usually the line segment B. The K value of the line segment B is usually smaller than that in the line segment A because of the actions of the vertical electric field $V_{GS}$, the horizontal electric field $V_{DS}$, W×L, and W/L. In the analysis, the horizontal electric field $V_{DS}$ must be a constant. However, the K value is still affected by the vertical electric field $V_{GS}$ and the dimensions of the transistors. Therefore, the voltage-current relationship is not merely influenced by the quadratic term of the linear region. Whether Equation (4) really meets the requirement of the linear region is also dependent on the voltage over the element because the electric field generated by the element influences the carrier mobility (K value) and makes the output current nonlinear. The discussion of the carrier mobility (K value) will be more correct and effective if it is based on the abovementioned facts.

Because of the fact that the carrier mobility varies with the gate voltage, Equation (5) is taken into consideration:

$$\mu_{eff} = \frac{\mu_0}{1 + \theta(V_{GS} - V_{TH})} \quad (5)$$

Substitute Equation (5) into Equation (4) to obtain Resulting Equation (1):

$$= \frac{K}{1 + \theta(V_{GS} - V_{TH})}[(V_{GS} - V_T)V_{DS}] \cong$$
$$K(V_{GS} - V_T)V_{DS}\left[\begin{array}{c}1 - \theta(V_{GS} - V_{TH}) + \\ \theta^2(V_{GS} - V_{TH})^2 - \ldots\end{array}\right] \cong$$
$$K(V_{GS} - V_T)V_{DS} - K\theta(V_{GS} - V_{TH})^2V_{DS} +$$
$$K\theta^2(V_{GS} - V_{TH})^3V_{DS} - \ldots$$

Resulting Equation (1)

When Equation (5) including the factor of carrier mobility degradation is substituted into the linear Equation (4), it is found that Resulting Equation (1) contains not only the first order term but also the higher order terms. Thus is proved that degradation is involved in the conversion curve of voltage and current.

As carrier mobility degradation still causes the resulting equation to contain quadratic and higher-order nonlinear terms, eliminating the quadratic term of the linear region is not an optimized approach to realize a high linearity voltage-current converter. The present invention intends to decrease the higher-order nonlinear terms to an optimized amount.

SUMMARY OF THE INVENTION

One objective of the present invention is to provide a high linearity voltage-current converter able to compensate for mobility degradation.

To achieve the abovementioned objective, the present invention proposes a high linearity voltage-current converter able to compensate for mobility degradation, which comprises a first constant current source circuit, a first current mirror unit, an amplifier, a second constant current source circuit, a second current mirror unit, a seventh MOS transistor and an eighth MOS transistor. The first constant current source circuit includes a first MOS transistor having a gate, a first terminal and a second terminal. The first current mirror unit includes a second MOS transistor and a third MOS transistor each having a gate, a source and a drain. The drain of the second MOS transistor is coupled to the first constant current source circuit.

The amplifier includes an output terminal, an inverted phase input terminal and a non-inverted phase input terminal. The output terminal of the amplifier is coupled to the gates of the second and third MOS transistors at a first joint point. The inverted phase input terminal of the amplifier is coupled to a second joint point of the first constant current source circuit.

The second current mirror unit includes a fifth MOS transistor and a sixth MOS transistor each having a gate, a source and a drain. The drain of the fifth MOS transistor is coupled to the drain of the third MOS transistor at a third joint point. The second constant current source circuit is coupled to the drain of the sixth MOS transistor.

The seventh MOS transistor includes a gate, a first terminal and a second terminal. The first terminal of the seventh MOS transistor is coupled to the third joint point via a first conducting wire. The eighth MOS transistor includes a gate, a first terminal and a second terminal. The first terminal of the eighth MOS transistor is coupled to a current output unit. The gate of the eighth MOS transistor is coupled to the gate of the seventh MOS transistor.

The high linearity voltage-current converter able to compensate for mobility degradation of the present invention has the following advantages:

1. The first constant current source circuit and the second constant current source circuit adopted in the present invention respectively use three reference voltages to compensate current in a voltage mode. The constant voltage source method disclosed in the present invention compensates current in a current mode, whereby it not only can supply specified voltage for specified applications but also can compensate current to maintain a given current.

2. The present invention can use the first constant current source circuit and the second constant current source circuit to satisfy some special requirements, such as a binary weighted current source or a digital/analog converter. The present invention can overcome the problem of insufficient driving capability, and the current supplied by the present invention is insensitive to temperature. The present invention can decrease the influence caused by variation in the power consumption or the fabrication process.

DETAILED DESCRIPTION OF THE PREFERRED EMBODIMENTS

Below, the technical contents of the present invention are described in detail with the embodiments. However, the embodiments are only to exemplify the present invention but not to limit the scope of the present invention.

Figure 1:
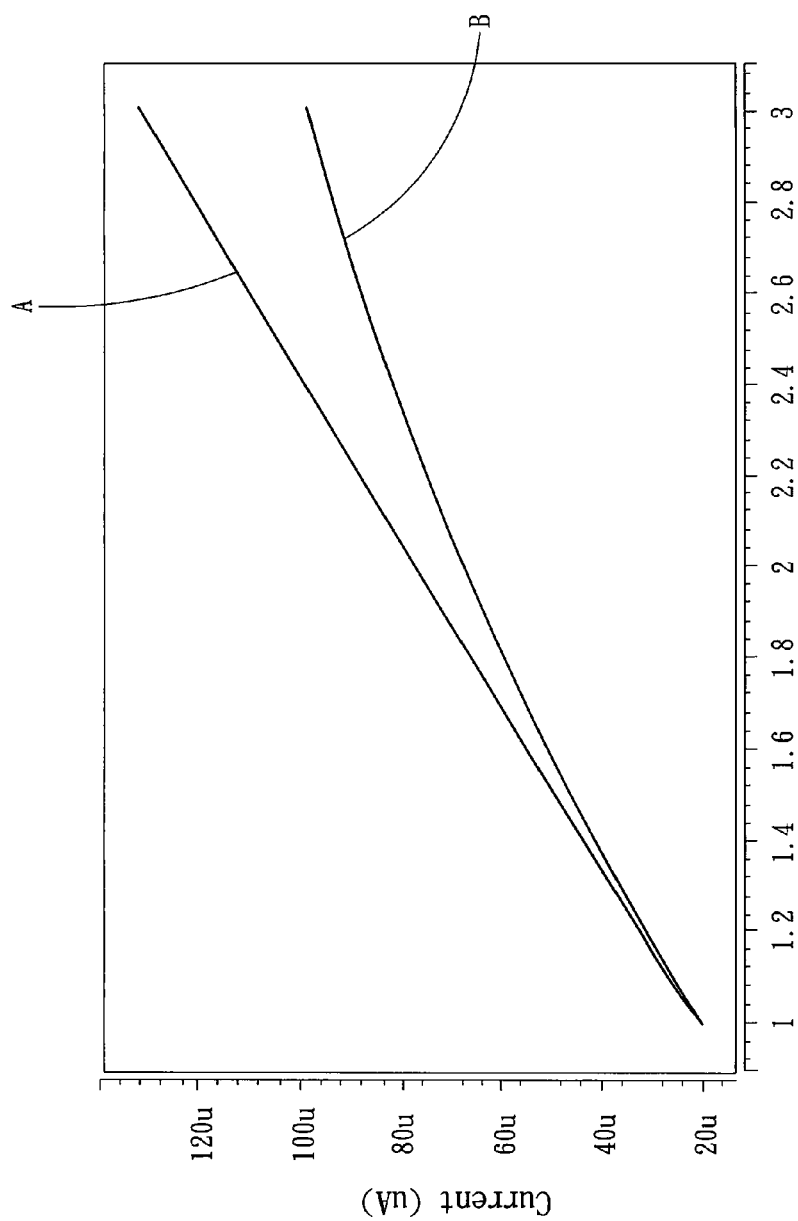
FIG. 1 is a diagram showing voltage-current relationships in the conventional technology.
Figure 2:
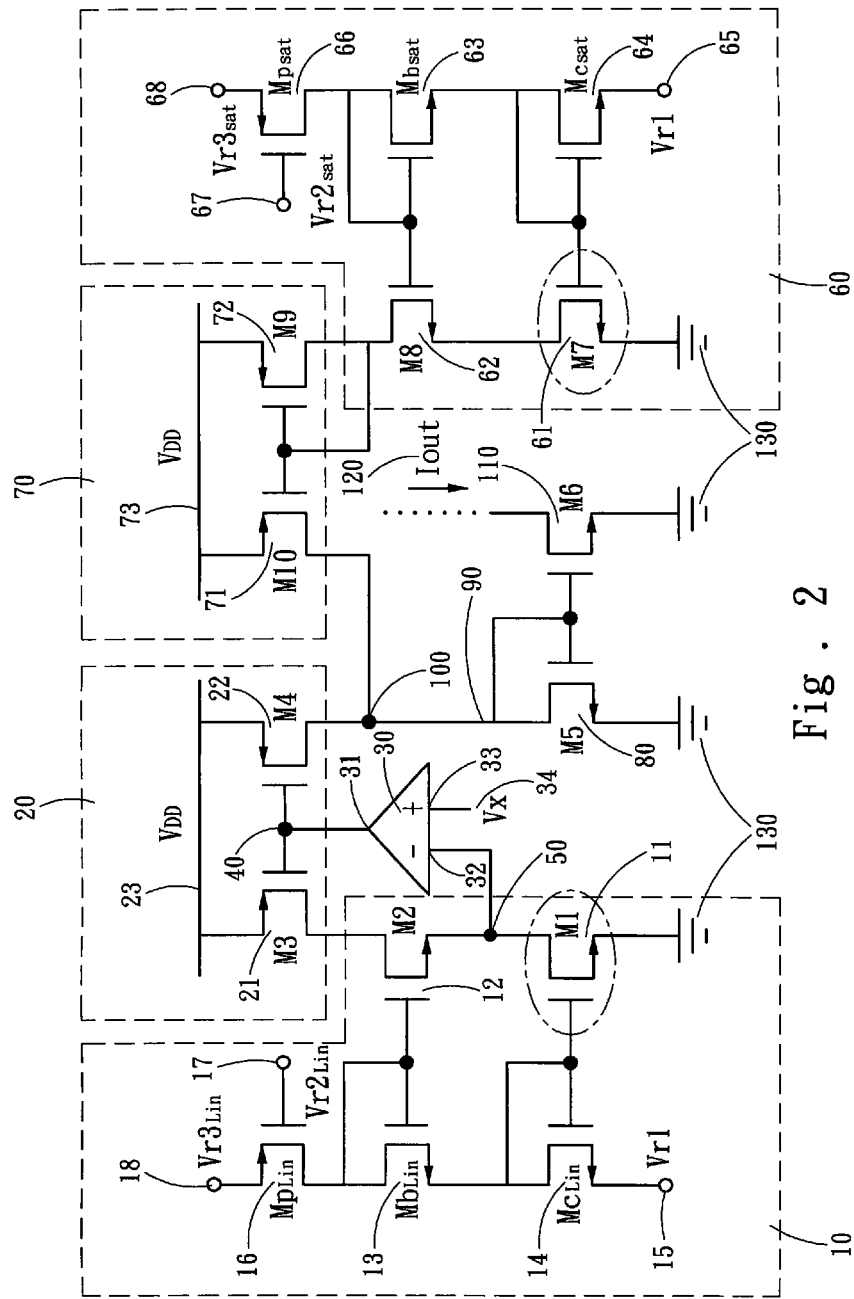
FIG. 2 is a diagram showing a circuitry of a high linearity voltage-current converter able to compensate for mobility degradation according to the present invention.

Refer to FIG. 2 for a circuitry according to a first embodiment of the present invention. The present invention proposes a high linearity voltage-current converter able to compensate for mobility degradation, which comprises a first constant current source circuit 10, a first current mirror unit 20, an amplifier 30, a second constant current source circuit 60, a second current mirror unit 70, a seventh MOS transistor 80 and an eighth MOS transistor 110. The first constant current source circuit 10 includes a first MOS transistor 11 having a gate, a first terminal and a second terminal. The first current mirror unit 20 includes a second MOS transistor 21 and a third MOS transistor 22 each having a gate, a source and a drain. The second and third MOS transistors 21 and 22 are P-type MOS transistors. The second MOS transistor 21 is coupled to the first constant current source circuit 10 via the drain thereof. The second terminal of the first MOS transistor 11 is connected to a grounding connection 130.

The first current mirror unit 20 also includes a first source voltage 23 respectively coupled to the sources of the second and third MOS transistors 21 and 22.

The amplifier 30 includes an output terminal 31, an inverted phase input terminal 32 and a non-inverted phase input terminal 33. The output terminal 31 of the amplifier 30 is coupled to the gates of the second and third MOS transistors 21 and 22 at a first joint point 40. The inverted phase input terminal 32 of the amplifier 30 is coupled to a second joint point 50 of the first constant current source circuit 10. The non-inverted phase input terminal 33 of the amplifier 30 is coupled to a voltage-stabilizing element 34, which is used to stabilize the performance of the first MOS transistor 11.

The second current mirror unit 70 includes a fifth MOS transistor 71 and a sixth MOS transistor 72 each having a gate, a source and a drain. The fifth and sixth MOS transistors 71 and 72 are P-type MOS transistors. The drain of the fifth MOS transistor 71 is coupled to the drain of the third MOS transistor 22 at a third joint point 100. The second constant current source circuit 60 is coupled to the drain of the sixth MOS transistor 72. The second current mirror unit 70 also includes a second source voltage 73 respectively coupled to the sources of the fifth and sixth MOS transistors 71 and 72.

The seventh MOS transistor 80 includes a gate, a first terminal and a second terminal. The first terminal of the seventh MOS transistor 80 is coupled to the third joint point 100 via a first conducting wire 90. The gate of the seventh MOS transistor 80 is coupled to the first terminal of the seventh MOS transistor 80 to function as a diode.

The eighth MOS transistor 110 includes a gate, a first terminal and a second terminal. The first terminal of the eighth MOS transistor 110 is coupled to a current output unit 120. The gate of the eighth MOS transistor 110 is coupled to the gate of the seventh MOS transistor 80. The first, seventh, and eighth MOS transistors 11, 80, and 110 may be P-type (P-channel) MOS transistors or N-type (N-channel) MOS transistors. The drains of the abovementioned MOS transistors are defined to be the first terminals, and the sources are defined to be the second terminals. When the abovementioned MOS transistors adopt different type MOS transistors, the definitions of the first and second terminals are also changed correspondingly.

The seventh and eighth MOS transistors 80 and 110 are respectively coupled to the grounding connection 130 via the second terminals thereof.

The first constant current source circuit 10 also includes a ninth MOS transistor 12, a tenth MOS transistor 13, an eleventh MOS transistor 14 and a twelfth MOS transistor 16.

The ninth MOS transistor 12 has a gate, a first terminal and a second terminal. The second terminal of the ninth MOS transistor 12 is coupled to the first terminal of the first MOS transistor 11 at the second joint point 50. The first terminal of the ninth MOS transistor 12 is coupled to the drain of the second MOS transistor 21.

The tenth MOS transistor 13 has a gate, a first terminal and a second terminal. The gate of the tenth MOS transistor 13 is coupled to the gate of the ninth MOS transistor 12. The gate of the tenth MOS transistor 13 is coupled to the first terminal of the tenth MOS transistor 13, whereby the tenth MOS transistor 13 can function as a diode.

The eleventh MOS transistor 14 has a gate, a first terminal and a second terminal. The second terminal of the eleventh MOS transistor 14 is coupled to a first reference electrode 15. The gate of the eleventh MOS transistor 14 is coupled to the gate of the first MOS transistor 11. The gate of the eleventh MOS transistor 14 is coupled to the first terminal of the eleventh MOS transistor 14, whereby the eleventh MOS transistor 14 can function as a diode. The tenth MOS transistor 13, the eleventh MOS transistor 14 and the twelfth MOS transistor 16 are cascaded.

The twelfth MOS transistor 16 has a gate, a source and a drain. The twelfth MOS transistor 16 is a P-type MOS transistor. The gate and source of the twelfth MOS transistor 16 are respectively coupled to a second reference electrode 17 and a third reference electrode 18.

The ninth, tenth, and eleventh MOS transistors 12, 13, and 14 may be P-type (P-channel) MOS transistors or N-type (N-channel) MOS transistors. The drains of the abovementioned MOS transistors are defined to be the first terminals, and the sources are defined to be the second terminals. When the abovementioned MOS transistors adopt different type MOS transistors, the definitions of the first and second terminals are also changed correspondingly.

The second constant current source circuit 60 includes a fourth MOS transistor 61, a thirteenth MOS transistor 62, a fourteenth MOS transistor 63, a fifteenth MOS transistor 64, and a sixteenth MOS transistor 66.

The fourth MOS transistor 61 has a gate, a first terminal and a second terminal. The second terminal of the fourth MOS transistor 61 is coupled to the grounding connection 130.

The thirteenth MOS transistor 62 has a gate, a first terminal and a second terminal. The second terminal of the thirteenth MOS transistor 62 is coupled to the first terminal of the fourth MOS transistor 61. The first terminal of the thirteenth MOS transistor 62 is coupled to the drain of the sixth MOS transistor 72.

The fourteenth MOS transistor 63 has a gate, a first terminal and a second terminal. The gate of the fourteenth MOS transistor 63 is coupled to the gate of the thirteenth MOS transistor 62. The gate of the fourteenth MOS transistor 63 is coupled to the first terminal of the fourteenth MOS transistor 63, whereby the fourteenth MOS transistor 63 can function as a diode.

The fifteenth MOS transistor 64 has a gate, a first terminal and a second terminal. The second terminal of the fifteenth MOS transistor 64 is coupled to a fourth reference electrode 65. The fourth reference electrode 65 is equipotential to the first reference electrode 15. The gate of the fifteenth MOS transistor 64 is coupled to the gate of the fourth MOS transistor 61. The gate of the fifteenth MOS transistor 64 is coupled to the first terminal of the fifteenth MOS transistor 64, whereby the fifteenth MOS transistor 64 can function as a diode. The fourteenth MOS transistor 63, the fifteenth MOS transistor 64 and the sixteenth MOS transistor 66 are cascaded.

The sixteenth MOS transistor 66 has a gate, a first terminal and a second terminal. The sixteenth MOS transistor 66 is a P-type MOS transistor. The gate and source of the sixteenth MOS transistor 66 are respectively coupled to a fifth reference electrode 67 and a sixth reference electrode 68.

The fourth MOS transistor 61, the ninth MOS transistor 12, the tenth MOS transistor 13, the eleventh MOS transistor 14, the thirteenth MOS transistor 62, the fourteenth MOS transistor 63 and the fifteenth MOS transistor 64 may be P-type (P-channel) MOS transistors or N-type (N-channel) MOS transistors. The drains of the abovementioned MOS transistors are defined to be the first terminals, and the sources are defined to be the second terminals. When the abovementioned MOS transistors adopt different type MOS transistors, the definitions of the first and second terminals are also changed correspondingly.

Figure 3:
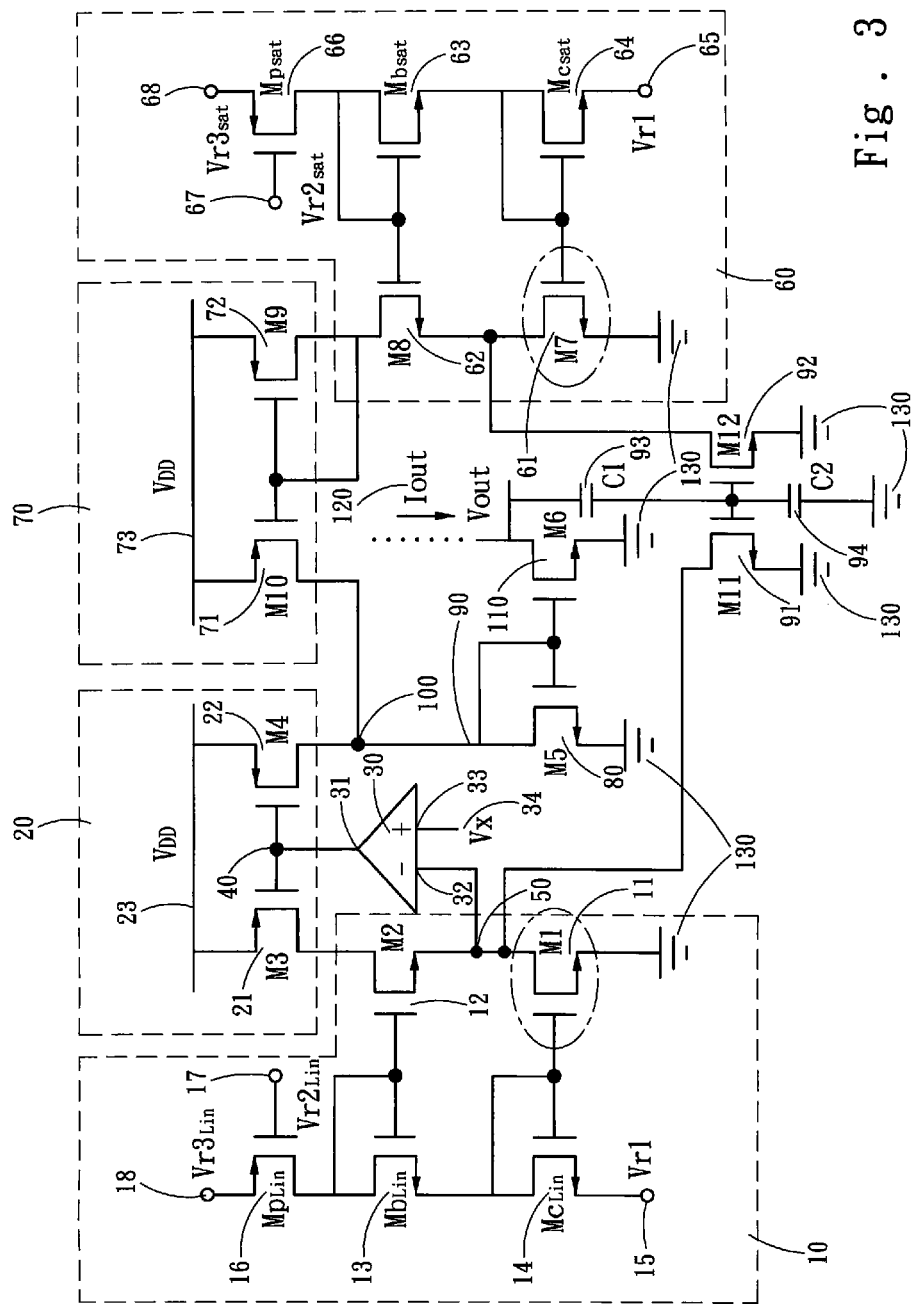
FIG. 3 is a diagram showing a circuitry of a high linearity voltage-current converter able to compensate for mobility degradation and having a negative feedback loop according to the present invention.

Refer to FIG. 3 for a second embodiment according to the present invention. The present invention may incorporate a negative feedback loop and further comprises a seventeenth MOS transistor 91, an eighteenth MOS transistor 92, a first capacitor 93 and a second capacitor 94. The gates of the seventeenth MOS transistor 91 and the eighteenth MOS transistor 92 are coupled to each other and also coupled to one end of each of the first and second capacitors 93 and 94. The second terminals of the seventeenth MOS transistor 91 and the eighteenth MOS transistor 92 are coupled to the grounding connection 130. The first terminals of the seventeenth MOS transistor 91 and the eighteenth MOS transistor 92 are respectively coupled to the second joint point 50 and the first terminal of the fourth MOS transistor 61. The other ends of the first and second capacitors 93 and 94 are respectively coupled to the first terminal of the eighth MOS transistor 110 and the grounding connection 130.

Figure 4:
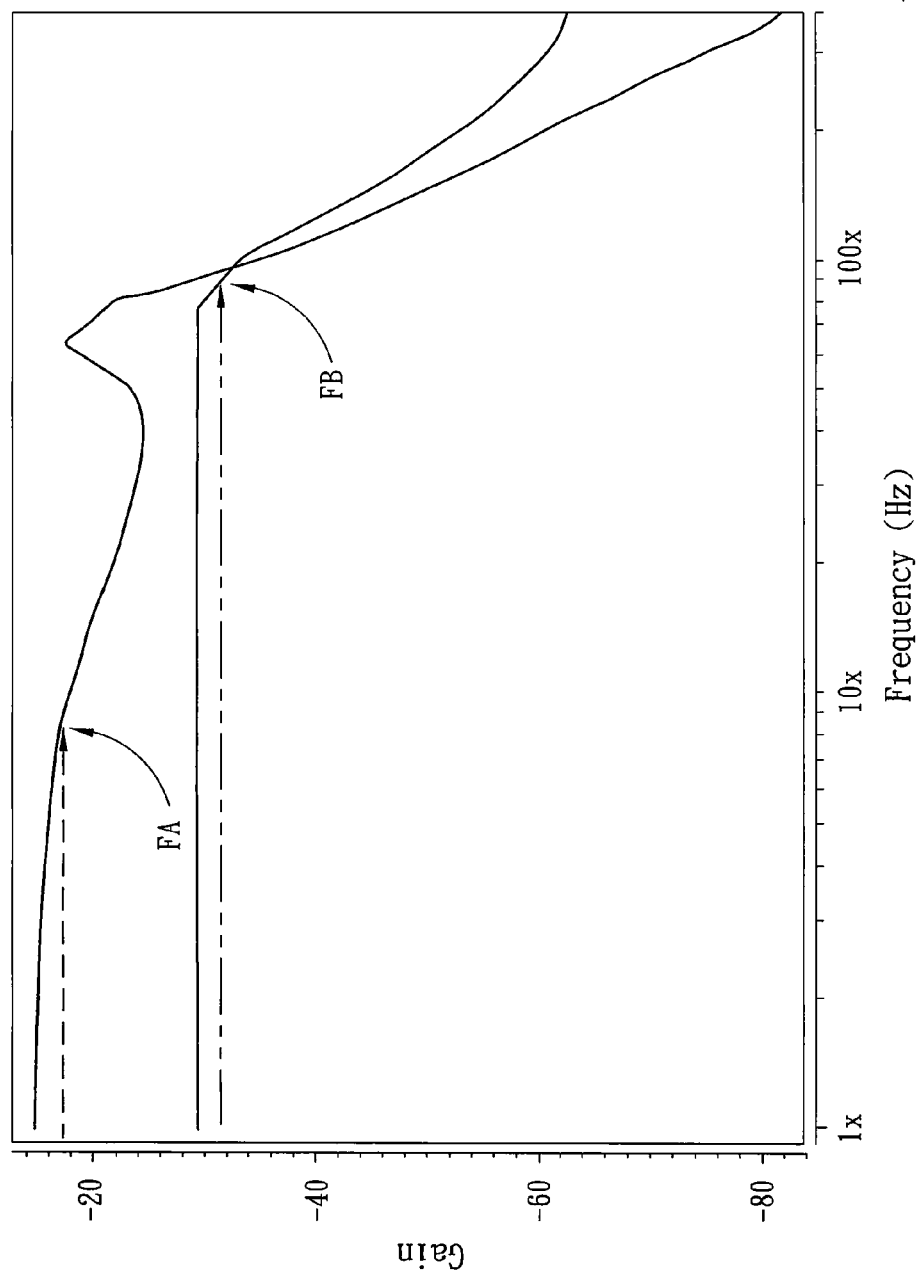
FIG. 4 is a diagram showing the frequency response curves of the circuits shown in FIG. 2 and FIG. 3.

Refer to FIG. 4. The output current is inverse proportional to the output voltage. The partial voltages of the first and second capacitors 93 and 94 enables the seventeenth MOS transistor 91 working in the linear region and the eighteenth MOS transistor 92 working in the saturation region to generate compensative downward current curves. The negative feedback loop makes the currents of the second MOS transistor 21 and the sixth MOS transistor 72 increase. Thereby, the negative feedback loop can stabilize the circuit and decrease the low-frequency gain. Further, the zero point is moved to a higher frequency, and the bandwidth of the circuit is effectively increased. The frequency response curve of the circuit without the negative feedback loop is FA having a bandwidth of about 9.87 MHz, and the frequency response curve of the circuit with the negative feedback loop is FB having a bandwidth of about 94.9 MHz.

The Inventor of the present invention possesses a R.O.C. patent No. I237948—a "Constant Current Source Able to Regulate and Compensate Threshold Voltage and Channel Length". The present invention utilizes the prior art to increase the durability, stability and PSRR (Power Supply Rejection Ratio) of the circuit.

Suppose $$V_{DS} = V_X = A \qquad \text{(Assumption 1)}$$

$$\frac{V_{DS}^2}{2} = \frac{V_X^2}{2} = B \qquad \text{(Assumption 2)}$$

$$V_{GS} - V_T = V_i \qquad \text{(Assumption 3)}$$

$$K_{Lin} = \mu_n C_{ox} \left(\frac{W}{L}\right)_{M_{lin}} \qquad \text{(Assumption 4)}$$

$$K_{Sat} = \frac{1}{2}\mu_n C_{ox} \left(\frac{W}{L}\right)_{M_{Sat}} \qquad \text{(Assumption 5)}$$

Substitute the equations of the assumptions 1, 2, 3, 4 and 5 into the equation of the linear region of the conventional technology and obtain Resulting Equation (2):

$$I_{Lin} = K_{Lin}\left[(V_{GS} - V_T)V_{DS} - \frac{V_{DS}^2}{2}\right] = \qquad \text{Resulting Equation (2)}$$
$$K_{Lin}[(V_i)A - B] \cong \frac{K_{Lin}}{1 + \theta_{Lin}(V_i)}(V_i)A$$

wherein $V_{DS}$ is a minor voltage value and B is thus omitted. Substitute the equations of the assumptions 1, 2, 3, 4 and 5 into the equation of the saturation region of the conventional technology and obtain Resulting Equation (3):

$$I_{Sat} = K_{Sat}(V_i)^2 \cong \frac{K_{Sat}}{1+\theta_{Sat}(V_i)}(V_i)^2 \quad \text{Resulting Equation (3)}$$

Sum up $I_{Lin}$ and $I_{Sat}$ and obtain Resulting Equation (4):

$$I_{out} = I_{Lin} + I_{Sat} \cong$$
$$\frac{K_{Lin}}{1+\theta_{Lin}(V_i)}(V_i)A + \frac{K_{Sat}}{1+\theta_{Sat}(V_i)}(V_i)^2 \cong$$
$$K_{Lin}(V_i)A(1 - \theta_{Lin}V_i + \theta_{Lin}^2 V_i^2 - \theta_{Lin}^3 V_i^3) +$$
$$K_{Sat}V_i^2(1 - \theta_{Sat}V_i + \theta_{Sat}^2 V_i^2) \cong AK_{Lin}V_i -$$
$$AK_{Lin}\theta_{Lin}V_i^2 + AK_{Lin}\theta_{Lin}^2 V_i^3 - AK_{Lin}\theta_{Lin}^3 V_i^4 +$$
$$K_{Sat}V_i^2 - K_{Sat}\theta_{Sat}V_i^3 + K_{Sat}\theta_{Sat}^2 V_i^4 \quad \text{Resulting Equation (4)}$$

Arrange Resulting Equation (4) and obtain Resulting Equations (5), (6) and (7):

$$AK_{Lin}\theta_{Lin} = K_{Sat} \quad \text{Resulting Equation (5)}$$

$$AK_{Lin}\theta_{Lin}^2 = K_{Sat}\theta_{Sat} \quad \text{Resulting Equation (6)}$$

$$AK_{Lin}\theta_{Lin}^3 = K_{Sat}\theta_{Sat}^2 \quad \text{Resulting Equation (7)}$$

Arrange Resulting Equation (5) and obtain Resulting Equation (8):

$$A\theta_{Lin} = \frac{K_{Sat}}{K_{Lin}} \quad \text{Resulting Equation (8)}$$

As $A\theta_{Lin}$ in Resulting Equation (8) is very small, $K_{Lin} \gg K_{Sat}$ and $(W_{Lin}/L_{Lin}) \gg (W_{Sat}/L_{Sat})$. Thus, $\theta_{Sat} \neq \theta_{Lin}$. Further, $\theta$ decreases and $\theta_{Sat} > \theta_{Lin}$ because the value of W×L increases.

It may be derived from the Resulting Equation (6) and the Resulting Equation (8) that $K_{Sat}\theta_{Sat} > AK_{Sat}\theta_{Lin}^2$, which may also be regarded as $K_{sat}(\theta_{Lin}+\Delta\theta) > AK_{Sat}\theta_{Lin}^2$. As the value of W×L increases and $\theta$ decreases, $K_{Sat}$ increases and $K_{Sat} > AK_{Sat}\theta_{Lin}$. Thus, Resulting Equations (5), (6) and (7) cannot be satisfied simultaneously.

Let $$\Delta = K_{Sat}V_i^2 - AK_{Lin}\theta_{Lin}V_i^2 + AK_{Lin}\theta_{Lin}^2 V_i^3 - K_{Sat}\theta_{Sat}V_i^3 + K_{Sat}\theta_{Sat}^2 V_i^4 - AK_{Lin}\theta_{Lin}^3 V_i^4$$

and $$\Delta' = 2(K_{Sat} - AK_{Lin}\theta_{Lin})V_i + 3(AK_{Lin}\theta_{Lin}^2 V_i^3 - K_{Sat}\theta_{Sat}V_i^3)V_i^2 + 4(K_{Sat}\theta_{Sat}^2 V_i^4 - AK_{Lin}\theta_{Lin}^3 V_i^4)V_i^3$$

It is intended to make the function become zero or a constant after the first order differentiation. However, after the first order differentiation, $\Delta'$ still has nonlinear terms whose orders are higher than that of the linear terms. This fact makes us have to perform a second order differentiation of the function and let the second order differentiation of the function be zero to see whether a condition can be found therefrom.

The second order differentiation of the function is expressed by $$\Delta'' = 2(K_{Sat} - AK_{Lin}\theta_{Lin}) + 6(AK_{Lin}\theta_{Lin}^2 - K_{Sat}\theta_{Sat})V_i + 12(K_{Sat}\theta_{Sat}^2 - AK_{Lin}\theta_{Lin}^3)V_i^2 = 0$$

As $\theta_{Lin}$ and $\theta_{Sat}$ vary with $V_{GS}$, they are not constants. Thus, the result of the second order differentiation is harder to be zero. The objective of the present invention is to make the result of the second order differentiation approaches zero and decrease the error of $\Delta$. Let the values of the above formulae inside the parentheses approach zero:

$$(K_{Sat} - AK_{Lin}\theta_{Lin}) \approx 0$$

$$(AK_{Lin}\theta_{Lin}^2 - K_{Sat}\theta_{Sat}) \approx 0$$

$$(K_{Sat}\theta_{Sat}^2 - AK_{Lin}\theta_{Lin}^3) \approx 0$$

It should make $\Delta''$ approach zero as much as possible. Arrange the above equations and obtain Resulting Equations (9), (10) and (11):

$$K_{Sat} - AK_{Lin}\theta_{Lin} = 0 \Rightarrow \frac{K_{Sat}}{K_{Lin}} = A\theta_{Lin} \quad \text{Resulting Equation (9)}$$

$$AK_{Lin}\theta_{Lin}^2 - K_{Sat}\theta_{Sat} = 0 \Rightarrow \frac{K_{Sat}}{K_{Lin}} = A\theta_{Lin}\left(\frac{\theta_{Lin}}{\theta_{Sat}}\right) \quad \text{Resulting Equation (10)}$$

$$K_{Sat}\theta_{Sat}^2 - AK_{Lin}\theta_{Lin}^3 = 0 \Rightarrow \frac{K_{Sat}}{K_{Lin}} = A\theta_{Lin}\left(\frac{\theta_{Lin}}{\theta_{Sat}}\right)^2 \quad \text{Resulting Equation (11)}$$

Couple Resulting Equations (9), (10) and (11) and obtain simultaneous solutions:

From Resulting Equations (9) and (10), $$A\theta_{Lin}\left(1 - \frac{\theta_{Lin}}{\theta_{Sat}}\right) \Rightarrow 0 \quad \text{Resulting Equation (12)}$$

From Resulting Equations (10) and (11), $$A\frac{\theta_{Lin}^2}{\theta_{Sat}}\left(1 - \frac{\theta_{Lin}}{\theta_{Sat}}\right) \Rightarrow 0 \quad \text{Resulting Equation (13)}$$

From Resulting Equations (9) and (11), $$A\theta_{Lin}\left(1 - \left(\frac{\theta_{Lin}}{\theta_{Sat}}\right)^2\right) \Rightarrow 0 \quad \text{Resulting Equation (14)}$$

It is necessary to repeatedly modify $K_{Lin}$ and $K_{Sat}$ to let Resulting Equations (12), (13) and (14) approach zero.

In conclusion, the present invention proposes a high linearity voltage-current converter able to compensate for mobility degradation. The simulation result shows that the present invention can effectively solve the conventional problems of carrier mobility degradation, threshold voltage variation, and supply voltage drift. Thus, the electronic components used in the present invention have more stable threshold voltage and supply voltage. Therefore, the present invention can promote more efficiently, reduce additional energy loss and decrease operation cost for industry.

What is claimed is:
1. A high linearity voltage-current converter able to compensate for mobility degradation, comprising:
a first constant current source circuit including a first MOS (Metal Oxide Semiconductor) transistor having a gate, a first terminal and a second terminal;
a first current mirror unit including a second MOS transistor and a third MOS transistor each having a gate, a source and a drain, wherein said second MOS transistor is coupled to said first constant current source circuit via said drain thereof;

an amplifier including an output terminal, an inverted phase input terminal and a non-inverted phase input terminal, wherein said output terminal of said amplifier is coupled to said gates of said second and said third MOS transistors at a first joint point, and wherein said inverted phase input terminal of said amplifier is coupled to a second joint point of said first constant current source circuit;

a second current mirror unit including a fifth MOS transistor and a sixth MOS transistor each having a gate, a source and a drain, wherein said drain of said fifth MOS transistor is coupled to said drain of said third MOS transistor at a third joint point;

a second constant current source circuit coupled to said drain of said sixth MOS transistor;

a seventh MOS transistor including a gate, a first terminal and a second terminal, wherein said first terminal of said seventh MOS transistor is coupled to said third joint point via a first conducting wire; and an eighth MOS transistor including a gate, a first terminal and a second terminal, wherein said first terminal of said eighth MOS transistor is coupled to a current output unit, and wherein said gate of said eighth MOS transistor is coupled to said gate of said seventh MOS transistor.

2. The high linearity voltage-current converter able to compensate for mobility degradation according to claim 1, wherein said second terminal of said first MOS transistor is connected to a grounding connection.

3. The high linearity voltage-current converter able to compensate for mobility degradation according to claim 1, wherein each of said first MOS transistor, said seventh MOS transistor, and said eighth MOS transistor is selected from a group consisting of a P-type MOS transistor and an N-type MOS transistor; drains of said first MOS transistor, said seventh MOS transistor, and said eighth MOS transistor are defined to be said first terminals; sources of said first MOS transistor, said seventh MOS transistor, and said eighth MOS transistor are defined to be said second terminals.

4. The high linearity voltage-current converter able to compensate for mobility degradation according to claim 1, wherein said second MOS transistor, said third MOS transistor, said fifth MOS transistor, and said sixth MOS transistor are P-type MOS transistors.

5. The high linearity voltage-current converter able to compensate for mobility degradation according to claim 1, wherein said first constant current source circuit further includes a ninth MOS transistor having a gate, a first terminal and a second terminal, wherein said second terminal of said ninth MOS transistor is coupled to said first terminal of said first MOS transistor via said second joint point, and wherein said first terminal of said ninth MOS transistor is coupled to said drain of said second MOS transistor;

a tenth MOS transistor having a gate, a first terminal and a second terminal, wherein said gate of said tenth MOS transistor is coupled to said gate of said ninth MOS transistor, and wherein said gate of said tenth MOS transistor is coupled to said first terminal of said tenth MOS transistor, whereby said tenth MOS transistor can function as a diode;

an eleventh MOS transistor having a gate, a first terminal and a second terminal, wherein said second terminal of said eleventh MOS transistor is coupled to a first reference electrode, and wherein said gate of said eleventh MOS transistor is coupled to said gate of said first MOS transistor, and wherein said gate of said eleventh MOS transistor is coupled to said first terminal of said eleventh MOS transistor, whereby said eleventh MOS transistor can function as a diode; and a twelfth MOS transistor having a gate, a source and a drain, wherein said gate and said source of said twelfth MOS transistor are respectively coupled to a second reference electrode and a third reference electrode, and wherein said tenth MOS transistor, said eleventh MOS transistor and said twelfth MOS transistor are cascaded.

6. The high linearity voltage-current converter able to compensate for mobility degradation according to claim 5, wherein each of said ninth MOS transistor, said tenth MOS transistor, and said eleventh MOS transistor is selected from a group consisting of a P-type MOS transistor and an N-type MOS transistor; drains of said ninth MOS transistor, said tenth MOS transistor, and said eleventh MOS transistor are defined to be said first terminals; sources of said ninth MOS transistor, said tenth MOS transistor, and said eleventh MOS transistor are defined to be said second terminals.

7. The high linearity voltage-current converter able to compensate for mobility degradation according to claim 5, wherein said twelfth MOS transistor is a P-type MOS transistor.

8. The high linearity voltage-current converter able to compensate for mobility degradation according to claim 1, wherein said first current mirror unit further includes a first source voltage respectively coupled to said sources of said second MOS transistor and said third MOS transistor.

9. The high linearity voltage-current converter able to compensate for mobility degradation according to claim 1, wherein said non-inverted phase input terminal of said amplifier is coupled to a voltage-stabilizing element.

10. The high linearity voltage-current converter able to compensate for mobility degradation according to claim 1, wherein said second constant current source circuit further includes a fourth MOS transistor having a gate, a first terminal and a second terminal;

a thirteenth MOS transistor having a gate, a first terminal and a second terminal, wherein said second terminal of said thirteenth MOS transistor is coupled to said first terminal of said fourth MOS transistor, and wherein said first terminal of said thirteenth MOS transistor is coupled to said drain of said sixth MOS transistor;

a fourteenth MOS transistor having a gate, a first terminal and a second terminal, wherein said gate of said fourteenth MOS transistor is coupled to said gate of said thirteenth MOS transistor, and wherein said gate of said fourteenth MOS transistor is coupled to said first terminal of said fourteenth MOS transistor, whereby said fourteenth MOS transistor can function as a diode;

a fifteenth MOS transistor having a gate, a first terminal and a second terminal, wherein said second terminal of said fifteenth MOS transistor is coupled to a fourth reference electrode, and wherein said fourth reference electrode is equipotential to said first reference electrode, and wherein said gate of said fifteenth MOS transistor is coupled to said gate of said fourth MOS transistor, and wherein said gate of said fifteenth MOS transistor is coupled to said first terminal of said fifteenth MOS transistor, whereby said fifteenth MOS transistor can function as a diode; and a sixteenth MOS transistor having a gate, a source and a drain, wherein said gate and said source of said sixteenth MOS transistor are respectively coupled to a fifth reference electrode and a sixth reference electrode, and wherein said fourteenth MOS transistor, said fifteenth MOS transistor and said sixteenth MOS transistor are cascaded.

11. The high linearity voltage-current converter able to compensate for mobility degradation according to claim 10, wherein each of said fourth MOS transistor, said thirteenth MOS transistor, said fourteenth MOS transistor, and said fifteenth MOS transistor is selected from a group consisting of a P-type MOS transistor and an N-type MOS transistor; drains of said fourth MOS transistor, said thirteenth MOS transistor, said fourteenth MOS transistor, and said fifteenth MOS transistor are defined to be said first terminals; sources of said fourth MOS transistor, said thirteenth MOS transistor, said fourteenth MOS transistor, and said fifteenth MOS transistor are defined to be said second terminals.

12. The high linearity voltage-current converter able to compensate for mobility degradation according to claim 10, wherein said sixteenth MOS transistor is a P-type MOS transistor.

13. The high linearity voltage-current converter able to compensate for mobility degradation according to claim 10, wherein said second terminal of said fourth MOS transistor is coupled to a grounding connection.

14. The high linearity voltage-current converter able to compensate for mobility degradation according to claim 10 further including a seventeenth MOS transistor, an eighteenth MOS transistor, a first capacitor and a second capacitor, wherein said gates of said seventeenth MOS transistor and said eighteenth MOS transistor are coupled to each other and also coupled to one end of each of said first capacitor and said second capacitor, and wherein second terminals of said seventeenth MOS transistor and said eighteenth MOS transistor are coupled to a grounding connection, and wherein first terminals of said seventeenth MOS transistor and said eighteenth MOS transistor are respectively coupled to said second joint point and said first terminal of said fourth MOS transistor, and wherein the other ends of said first capacitor and said second capacitor are respectively coupled to said first terminal of said eighth MOS transistor and said grounding connection.

15. The high linearity voltage-current converter able to compensate for mobility degradation according to claim 1, wherein said second current mirror unit further includes a second source voltage respectively coupled to sources of said fifth MOS transistor and said sixth MOS transistor; said gate and said source of said sixth MOS transistor are coupled, whereby said sixth MOS transistor can function as a diode.

16. The high linearity voltage-current converter able to compensate for mobility degradation according to claim 1, wherein said gate of said sixth MOS transistor is coupled to said first terminal of said sixth MOS transistor, whereby said sixth MOS transistor can function as a diode.

17. The high linearity voltage-current converter able to compensate for mobility degradation according to claim 1, wherein said second terminals of said seventh MOS transistor and said eighth MOS transistor are coupled to a grounding connection; said gate of said seventh MOS transistor is coupled to said first terminal of said seventh MOS transistor, whereby said seventh MOS transistor can function as a diode.

* * * * *